(12) United States Patent
Kim et al.

(10) Patent No.: US 6,664,573 B2
(45) Date of Patent: Dec. 16, 2003

(54) AVALANCHE PHOTODIODE

(75) Inventors: Moon-Deock Kim, Songnam-shi (KR); Seung-Ryong Cho, Seoul (KR); Jinwook Burm, Koyang-shi (KR)

(73) Assignee: Samsung Electronics Co, Ltd., Suwon (KR)

( * ) Notice: Subject to any disclaimer, the term of this patent is extended or adjusted under 35 U.S.C. 154(b) by 21 days.

(21) Appl. No.: 10/071,008

(22) Filed: Feb. 7, 2002

(65) Prior Publication Data

US 2003/0057413 A1 Mar. 27, 2003

(30) Foreign Application Priority Data

Sep. 26, 2001 (KR) .......................... 2001-59499

(51) Int. Cl.⁷ ................ H01L 31/0328; H01L 31/0336; H01L 31/072; H01L 31/109
(52) U.S. Cl. ....................... 257/186; 257/433
(58) Field of Search ............ 257/1, 233, 291, 257/292, 184, 185, 186, 12, 13, 79, 81, 94, 99, 101, 102, 103, 113, 431, 432, 433, 434, 435, 438, 459, 461

(56) References Cited

U.S. PATENT DOCUMENTS 4,616,247 A * 10/1986 Chang et al. ............... 357/30
5,569,942 A * 10/1996 Kusakabe ................... 257/186
5,763,903 A * 6/1998 Mandai et al. .............. 257/186
2002/0076187 A1 * 6/2002 Coult et al. ................. 385/131

FOREIGN PATENT DOCUMENTS

JP 07142575 A * 6/1995

\* cited by examiner

Primary Examiner—Long Pham
Assistant Examiner—Dana Farahani
(74) Attorney, Agent, or Firm—Cha & Reiter

(57) ABSTRACT

An avalanche photodiode capable of generating a minimal surface leakage current as well as achieving a uniform electrical field. The avalanche photodiode includes a semiconductor substrate provided with a lower electrode underneath it, an amplification layer producing pairs of electron-holes through ionized collision of carriers injected by an internal electrical field, and an absorption layer producing the carriers according to splitting of the pairs of electron-holes by the electrical field. The avalanche photodiode further includes a contact layer formed on the absorption layer, with a core section in the center of the contact layer and a guard section surrounding the core section spaced apart from each other, and at least one upper electrode with a core electrode formed on the core section and a guard electrode formed on the guard section. The upper electrode generates the internal electrical field together with the lower electrode.

5 Claims, 4 Drawing Sheets

AVALANCHE PHOTODIODE

CLAIM OF PRIORITY

This application makes reference to and claims all the benefits accruing under 35 U.S.C. Section 119 from an application entitled "Avalanche Photodiode" filed with the Korean Industrial Property Office on Sep. 26, 2001 and there duly assigned Serial No. 2001-59499.

BACKGROUND OF THE INVENTION

1. Field of the Invention

The present invention generally relates to a technique of manufacturing a photodiode, and more particularly to an avalanche photodiode.

2. Description of the Related Art

In general, an avalanche photodiode is used for converting an input optical signal to an electrical signal, while amplifying the input signal through the avalanche effect by the injection of carriers into an area applied with a high electrical field. The avalanche photodiodes typically include a planar-type avalanche photodiode and a mesa-type avalanche photodiode, both of which have a common structure of a multiplicity of stacked layers with an amplifying layer and an absorbing layer on a semiconductor substrate. The planar avalanche photodiode, however, inherently has some degree of curvature at the edge portion of a p-n junction semiconductor, causing an electrical field in the edge portion to become higher when subject to the same bias voltage. The result is a gain in the spatial difference. Meanwhile, the mesa-type avalanche photodiode also has some advantage in achieving a spatially uniform electrical field. However, it still has disadvantages in that the surface leakage current is induced in the absorbing layers with a small band gap, thereby degrading reliability during operation.

SUMMARY OF THE INVENTION

The present invention has been proposed to solve the foregoing problems of the related art. Accordingly, the present invention is directed to an avalanche photodiode that is capable of generating a minimal surface leakage current as well as achieving a uniform electrical field.

According to an aspect of the present invention, there is provided an avalanche photodiode, which includes a semiconductor substrate with a lower electrode underneath the substrate; an amplification layer producing pairs of electron-holes through ionized collision of carriers injected by an internal electrical field; and, an absorption layer producing the carriers in accordance with splitting of the pairs of electron-holes by the internal electrical field, wherein the pairs of electron-holes are excited by an incident light ray. The avalanche photodiode further includes a contact layer formed on the absorption layer, having a core section in the center of the contact layer and a guard section surrounding the core section, spaced apart from each other; and, at least one upper electrode comprising at least one core electrode formed on the core section and at least one guard electrode formed on the guard section. The upper electrode generates the internal electrical field together with the lower electrode.

Preferably, the avalanche photodiode further includes a charge layer formed between the amplification layer and the absorption layer in order to apply relatively low intensity or high intensity of electrical field respectively to the absorption layer and the amplification layer.

Preferably, the avalanche photodiode may further include a grading layer formed between the amplification layer and the absorption layer in order to inject the carriers into the amplification layer efficiently.

Preferably, the avalanche photodiode may further include an insulation layer deposited on an exposed surface of the amplification layer and the contact layer so as to insulate and protect the exposed surface of the amplification layer and the contact layer.

More preferably, the insulation layer may be made of a transparent material, so as to transmit a light ray incident on the avalanche photodiode inwardly.

BRIEF DESCRIPTION OF THE DRAWINGS

A more complete understanding of the method and apparatus of the present invention may be had by reference to the following detailed description when taken in conjunction with the accompanying drawings wherein.

DETAILED DESCRIPTION OF THE PREFERRED EMBODIMENT

In the following description, for purposes of explanation rather than limitation, specific details are set forth such as the particular architecture, interfaces, techniques, etc., in order to provide a thorough understanding of the present invention. For purposes of simplicity and clarity, detailed descriptions of well-known devices, circuits, and methods are omitted so as not to obscure the description of the present invention with unnecessary detail.

Now, a description will be made in detail regarding this invention with reference to the drawings.

Figure 6:
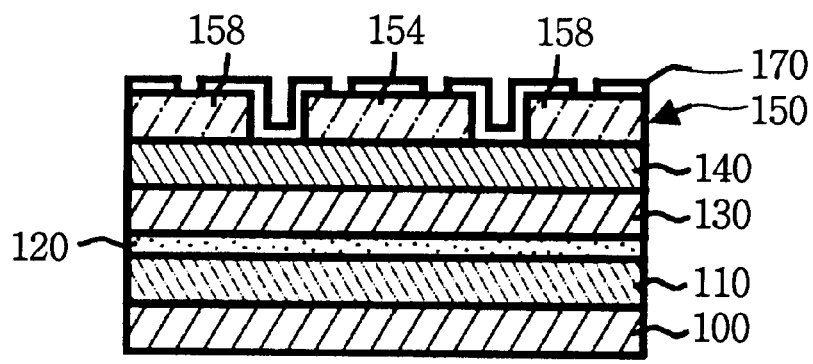
Figure 7:
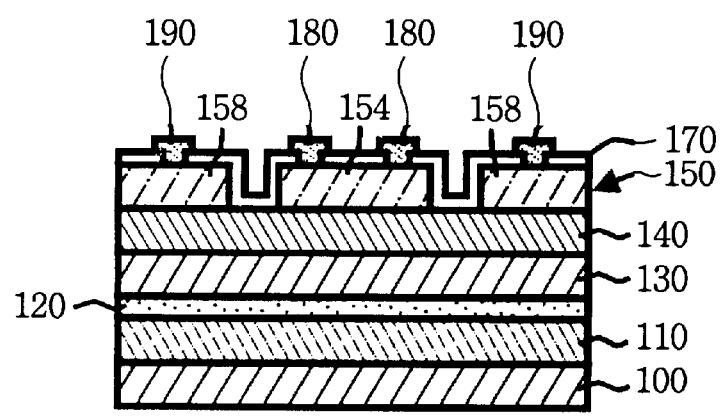
Figure 8:
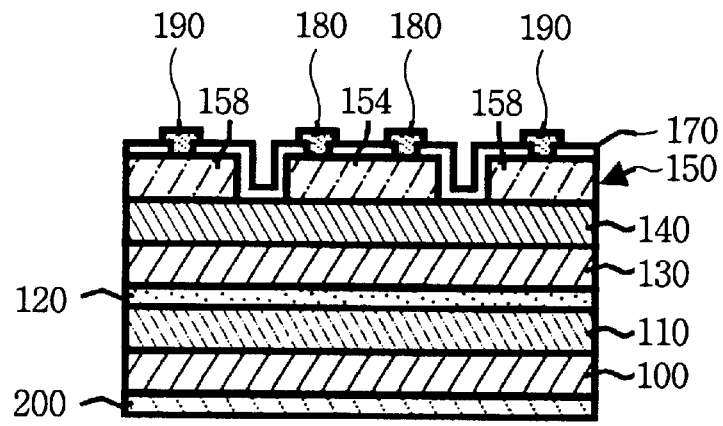

FIGS. 1 to 7 illustrate the process for fabricating an avalanche photodiode according to the preferred embodiment of the present invention, while FIG. 8 shows the final structure of the avalanche photodiode. As shown in FIG. 8, the inventive avalanche photodiode includes an n-type lower electrode 200, n-type InP substrate 100, n-type InP amplification layer 110, n-type InP charge layer 120, n-type InGaAsP grading layer 130, n-type InGaAs absorption layer 140, p-type InP contact layer 150, insulation layer 170, and p-type upper electrodes 180 and 190.

The substrate 100 is an n-type InP substrate, underneath which the n-type lower electrode 200 is formed. The n-type InP amplification layer 110 formed on the n-type InP substrate 100 internally generates an amplification gain, as carriers injected thereto produce new pairs of electron-holes through ionization collision. The n-type InP charge layer 120 on the InP amplification layer 110 is formed to apply a relatively low or high intensity of electrical field onto the n-type InGaAs absorption layer 140 and the n-type InP amplification layer 110, respectively. The n-type InGaAsP grading layer 130 formed on the n-type InP charge layer 120 serves to insert the above carriers into the n-type InP amplification layer 110 efficiently.

The n-type InGaAs absorption layer 140 formed on the n-type InGaAsP grading layer 130 functions to generate the carriers injected into the n-type InP amplification layer 110 by allowing the electron-hole pairs excited by the light beam incident upon the avalanche photodiode to split up by means of the electrical field applied thereto. The p-type InP contact layer 150 formed on the n-type InGaAs absorption layer 140 has a higher conductivity than the other semiconductor layers for the purpose of forming ohmic contacts with the p-type upper electrodes 180 and 190, and includes a core section 154 in the center region and guard section 158 that are spaced apart surrounding the core section 154. The guard section 158 being disposed apart from the core section 154 serves to isolate the core section electrically from the semiconductor surface exposed to the outside. That is to say, the guard section 158 functions to electrically isolate the core section 154, which may be forming an electrical path for the surface leakage current, from the semiconductor surface exposed to the outside, thereby substantially cutting off the path for the surface leakage current.

The insulation layer 170 formed on the n-type InGaAs absorption layer 140 and the p-type InP contact layer 150 is fabricated preferably with a transparent substance, such as SiNx, $SiO_2$ or polyimide, and serves to insulate and protect the exposed surfaces of the n-type InGaAs absorption layer 140 and the p-type InP contact layer 150. Furthermore, the sections of the insulation layer 170 formed on the p-type InP contact layer 150 are transmitted inwardly by the light beam incident on the avalanche photodiode. The p-type upper electrodes 180 and 190 formed on the p-type InP contact layer 150 consist of core electrodes 180 formed on the core section 154 and guard electrode 190 formed on the guard section 190. The core electrode 180 serves to form an activation region underneath it in accordance with the applied voltage, through which activation region the amplification is effected utilizing the avalanche effect. The guard electrode 190 serves to form a guard region underneath it in accordance with the applied voltage and to define the size of the activation region. In other words, as a contour line of electric potential defining the activation region and the contour line of electric potential defining the guard region do not cross each other, the size of the contour line of electric potential defining the activation region can be relatively adjusted by making a change to the size of the contour line of electric potential defining the guard region. For instance, making higher the voltage applied to the guard electrode 190 and keeping the voltage applied to the core electrode 180 as it was will extend the contour line of electric potential defining the guard region, which accordingly leads to a reduction of the contour line of electric potential defining the activation region relatively.

Figure 1:
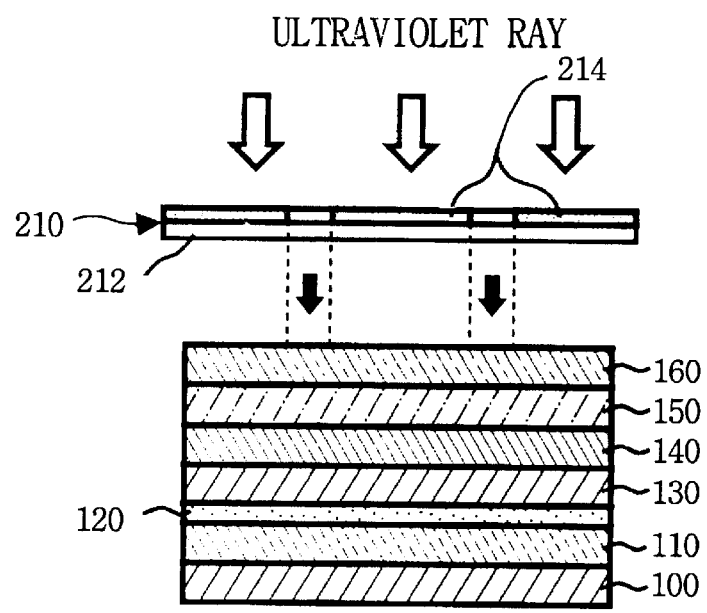
FIGS. 1 to 7 respectively show the fabrication stages of an avalanche photodiode according to a preferred embodiment of the present invention; and, FIG. 8 shows the structure of an avalanche photodiode according to a preferred embodiment of the present invention.

Referring to FIGS. 1 to 7, a detailed description will be made on the fabrication process for the avalanche photodiode, as shown in FIG. 8. Referring to FIG. 1, the n-type InP amplification layer 110, the n-type InP charge layer 120, the n-type InGaAsP grading layer 130, the n-type InGaAs absorption layer 140, the p-type InP contact layer 150 are deposited on the n-type InP substrate 100 in sequence utilizing various techniques, such as the liquid phase epitaxial growth (LPE Growth), molecular beam epitaxial growth (MBE Growth), or metalorganic chemical vapor deposition (MOCVD). A liquid photoresist is deposited onto the p-type InP contact layer 150, then a high-speed revolution is carried out to the n-type InP substrate 100 so that a fixed depth of photoresist layer 160 can be formed on the p-type InP contact layer 150.

Figure 2:
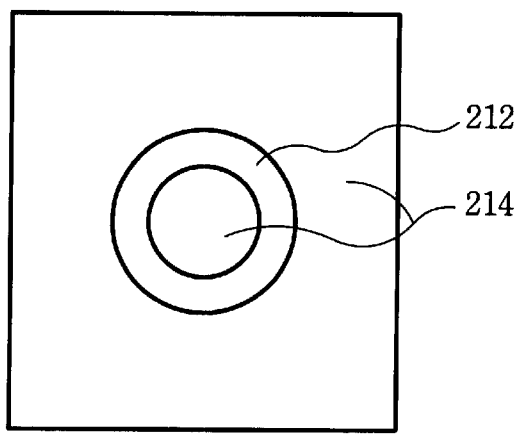

FIG. 2 schematically shows a prospective view of an amplitude mask 210 as shown in FIG. 1. Referring to FIGS. 1 and 2, an amplitude mask 210 having a ring-shaped slit 212 is positioned on the photoresist layer 160 to which the ultraviolet ray is irradiated. Here, the amplitude mask 210 passes the ultraviolet ray that passes only through the slit 212, while preventing the ultraviolet ray incident on the other area 214 except for the slit 212. Thus, an etching process is carried out after irradiating the photoresist layer 160 with the ultraviolet ray passing through the slit 212, so that the photoresist layer 160 as shown in FIG. 3 can be produced thereafter.

Figure 3:
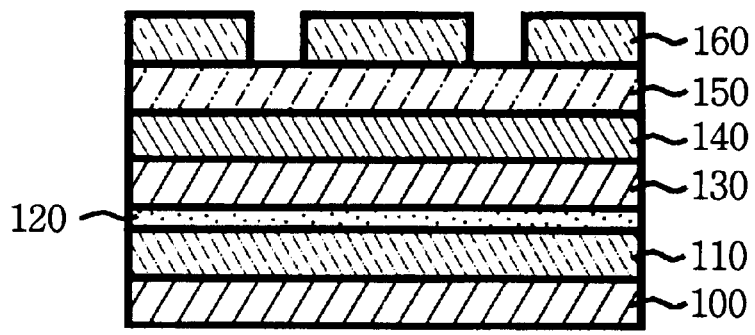
Figure 4:
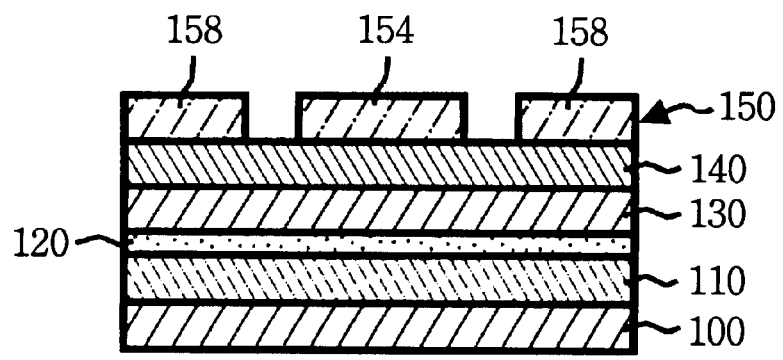

Referring to FIG. 3, a photoresist layer 160 with a recess that is similar to the shape of the slit 212 shown in FIG. 2 is formed. The upper surface of the p-type InP contact layer 150 is partially exposed to the exterior atmosphere through this recess. Thereafter, a part of the p-type InP contact layer 150 is etched out using the photoresist layer 160, where a reactive-ion-etching (RIE) process may be employed as an etching means for the p-type InP contact layer 150. Then, the etching of the photoresist 160 with a photoresist removal agent produces the p-type InP contact layer 150, consists of a core section 154 and its surrounding guard sections 158, being spaced from each other, as shown in FIG. 4.

Figure 5:
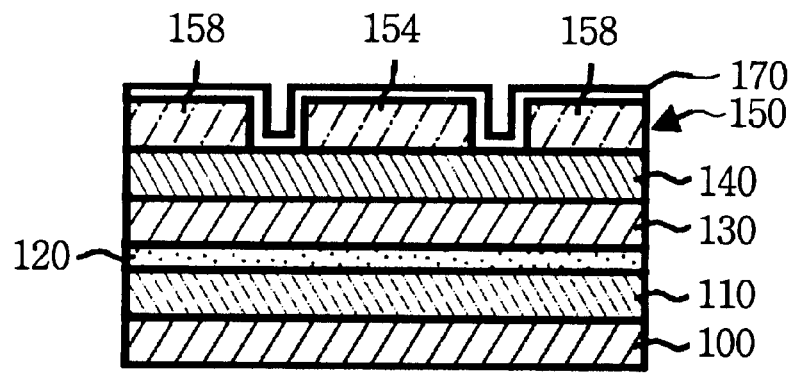

Referring to FIG. 5, the SiNx insulation layer 170 is deposited onto the entire exposed surface of the p-type InP contact layer 150 and the n-type InGaAs absorption layer 140 using the chemical vapor deposition technique.

Next, as shown in FIG. 6, a part of the SiNx insulation layer 170 formed on the p-type InP contact layer 150 is etched out utilizing the etching process.

Referring to FIG. 7, the core electrode 180 is formed on the exposed surface of the core section 154. Similarly, the guard electrode 190 is formed on the exposed surface of the guard section 158. Both electrodes 180 and 190 constitute the p-type upper electrodes.

As apparent from the foregoing description, the avalanche photodiode according to the present invention provides good isolation of the core section from the peripheral surfaces owing to the guard section surrounding the core section, in which the core section constitutes a contact layer with the mesa type. Thus, not only the uniform electrical field but also the minimal surface leakage current could be achieved in the avalanche photodiode according to the present invention. Furthermore, the avalanche photodiode according to the present invention has a further advantage in that the size of the activation region formed by the core electrode can be controlled using the guard electrode as the upper electrodes consist of the core electrodes and the guard electrodes.

While the preferred embodiments of the present invention have been illustrated and described, it will be understood by those skilled in the art that various changes and modifications may be made, and equivalents may be substituted for elements thereof without departing from the true scope of the present invention. In addition, many modifications may be made to adapt to a particular situation and the teaching of the present invention without departing from the central scope. Therefore, it is intended that the present invention not be limited to the particular embodiment disclosed as the best mode contemplated for carrying out the present invention, but that the present invention include all embodiments falling within the scope of the appended claims.

What is claimed is:

1. An avalanche photodiode having a semiconductor substrate provided with a lower electrode underneath said substrate, an amplification layer for producing pairs of electron-holes through an ionized collision of carriers injected by an internal electrical field, and an absorption layer for producing said carriers in accordance with splitting of the pairs of electron-holes by the internal electrical field, wherein the pairs of electron-holes are excited by an incident light ray, comprising:

a contact layer formed on said absorption layer, said contact layer having a core section in the center thereof and at least a guard section spaced apart from each and forming a gap so as to electrically isolate the core section and reduce leakage current, which is not filled by said absorption layer, between said core section and said guard section; and, at least one upper electrode comprising at least one core electrode formed on said core section and at least one guard electrode formed on said guard section, said upper electrode generating the internal electrical field in cooperation with said lower electrode; and an adjustable activation region underneath the at least one upper electrode for the internal electrical field and an adjustable guard region underneath the at least one guard electrode, wherein a contour line defining a size of the adjustable activation region and the adjustable guard region is determined by an amount of electric potential applied to both the at least one upper electrode and the at least one guard electrode.

2. The avalanche photodiode according to claim 1, further comprising a charge layer formed between said amplification layer and said absorption layer to apply relatively low intensity and high intensity of electrical field to said absorption layer and said amplification layer, respectively.

3. The avalanche photodiode according to claim 1, further comprising a grading layer formed between said amplification layer and said absorption layer to inject said carriers into said amplification layer.

4. The avalanche photodiode according to claim 1, further comprising an insulation layer deposited on an exposed surface of said amplification layer and said contact layer so as to insulate the exposed surface of said amplification layer and said contact layer.

5. The avalanche photodiode according to claim 4, wherein said insulation layer is made of a transparent material to transmit a light ray incident on the avalanche photodiode inwardly.

* * * * *